(12) United States Patent
Ghasemi Afshar et al.

(10) Patent No.: US 9,659,915 B2
(45) Date of Patent: May 23, 2017

(54) LIGHTING MODULE WITH SEMICONDUCTOR LIGHT SOURCES AND CARRIER PLATE

(71) Applicant: OSRAM GmbH, Munich (DE)

(72) Inventors: Farhang Ghasemi Afshar, Wenzenbach (DE); Axel Kaltenbacher, Mintraching (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/021,952

(22) PCT Filed: Aug. 22, 2014

(86) PCT No.: PCT/EP2014/067914
§ 371 (c)(1),
(2) Date: Mar. 15, 2016

(87) PCT Pub. No.: WO2015/036221
PCT Pub. Date: Mar. 19, 2015

(65) Prior Publication Data
US 2016/0225747 A1    Aug. 4, 2016

(30) Foreign Application Priority Data
Sep. 16, 2013 (DE) .................... 10 2013 218 541

(51) Int. Cl.
*H05B 33/08* (2006.01)
*H01L 25/075* (2006.01)
(Continued)

(52) U.S. Cl.
CPC ........ *H01L 25/0753* (2013.01); *H01L 33/483* (2013.01); *H01L 33/644* (2013.01);
(Continued)

(58) Field of Classification Search
CPC ............ H01L 25/07531; H01L 33/483; H01L 33/644; H01L 33/62; H01L 2224/48091; H01L 2224/48137
(Continued)

(56) References Cited

U.S. PATENT DOCUMENTS

2008/0303038 A1    12/2008 Grotsch et al.
2011/0156613 A1    6/2011 Nishimura et al.

FOREIGN PATENT DOCUMENTS

DE    4434274 A1    3/1996
DE    10245946 C1    10/2003
(Continued)

OTHER PUBLICATIONS

International Search Report based on Application No. PCT/EP2014/067914 (4 Pages) dated Nov. 5, 2014 (Reference Purpose Only).
(Continued)

*Primary Examiner* — Jimmy Vu
(74) *Attorney, Agent, or Firm* — Viering, Jentschura & Partner mbB

(57) ABSTRACT

Various embodiments may relate to a lighting module which is equipped with several semiconductor light sources, in particular LED-chips and includes a metallic carrier plate. Several metallic carrier substrates are arranged on the carrier plate and are electrically insulated therefrom. At least one semiconductor light source is arranged on the carrier substrates and the carrier substrates are electrically connected in series.

13 Claims, 4 Drawing Sheets

(51) Int. Cl.
*H01L 33/48* (2010.01)
*H01L 33/64* (2010.01)
*H01L 33/62* (2010.01)

(52) U.S. Cl.
CPC .... *H01L 33/62* (2013.01); *H01L 2224/48091* (2013.01); *H01L 2224/48137* (2013.01)

(58) Field of Classification Search
USPC ..... 315/209 R, 224–226, 291, 307, 308, 312
See application file for complete search history.

(56) References Cited

FOREIGN PATENT DOCUMENTS

| | | | |
|---|---|---|---|
| EP | 2315284 A2 | 4/2011 | |
| EP | 2346307 A2 | 7/2011 | |
| JP | EP 2315284 A2 * | 4/2011 | ............... F21K 9/00 |
| WO | 2006089512 A1 | 8/2006 | |

OTHER PUBLICATIONS

German Search Report based on Application No. 10 2013 218 541.3 (5 Pages) dated Mar. 26, 2014 (Reference Purpose Only).

\* cited by examiner

LIGHTING MODULE WITH SEMICONDUCTOR LIGHT SOURCES AND CARRIER PLATE

RELATED APPLICATIONS

The present application is a national stage entry according to 35 U.S.C. §371 of PCT application No.: PCT/EP2014/067914 filed on Aug. 22, 2014, which claims priority from German application No.: 10 2013 218 541.3 filed on Sep. 16, 2013, and is incorporated herein by reference in its entirety.

TECHNICAL FIELD

Various embodiments may relate to a lighting module with a number of semiconductor light sources, in particular LED chips, the lighting module including a carrier plate. Various embodiments also relate to a method for operating such a lighting module. Various embodiments can be applied in particular to LED lighting modules based on CoB ("Chip-on-Board") technology.

BACKGROUND

FIG. 1 shows a conventional lighting module 101 based on CoB technology with a carrier plate 102 of aluminum, on the reflective front side 103 of which a number of semiconductor light sources in the form of LED chips 104 have been applied. The use of such a carrier plate 102 has two advantages, to be specific a high reflectivity with at the same time a high thermal conductivity.

The LED chips 104 are electrically insulated with respect to the carrier plate 102 by means of a dielectric chip substrate and are electrically interconnected to one another in series by bonding wires 105. A first LED chip 104, 104$h$ of the series is connected by way of a bonding wire 105 to a first terminal contact 106$h$, which is at a highest electrical potential HV. A last LED chip 104$l$ of the series is connected to a second terminal contact 106$l$, which is at a lowest electrical potential LV. The individual LED chips 104 should be interconnected in a series such that the sum of their forward voltages corresponds to the voltage HV-LV applied altogether to this LED series 104$h$ . . . , 104$l$.

The front side 103 of the carrier plate 102 is cast along with the LED chips 104 and the bonding wires 105 by means of a light-transmissive casting compound 107, for example silicone or epoxy resin, which may for example include a filler such as diffuser particles and/or phosphor particles.

Since the carrier plate 102 is electrically conductive, it is less suitable for using the lighting module 101 with a high voltage HV-LV applied to the series 104$h$ . . . 104$l$ of LED chips 104 or with a high voltage HV-LV applied to the terminal contacts 106$h$, 106$l$. The high voltage may for example correspond to a peak voltage of an alternating voltage signal or correspond to a direct voltage.

Since the thickness of an LED chip 104 is comparatively small (typically in the range of a few 100 micrometers), the application of a high voltage HV-LV leads to a strong electrical field F between the bonding wire 105 and the chip substrate of the LED chip 104 through the casting compound 106 and the remaining part of the LED chip 104, in particular in the region of the first LED chip 104$h$. In this case, a secondary electrical path P to the LED series circuit is disadvantageously closed.

A further problem occurs if the carrier plate 102 is connected by its rear side 108 to a metallic heat sink 110 by way of an electrically insulating intermediate layer 109, as shown in FIG. 2. The heat sink 110 is typically electrically connected to ground GND. In this case, a capacitive coupling also occurs between the bonding wires 105 and the heat sink 110.

As shown in the equivalent circuit diagram from FIG. 3, corresponding to FIG. 2, for each bonding wire 105 there are at least two capacitances between this bonding wire 105 and the heat sink 110, to be specific a first capacitance Cws between the bonding wire 105 and the carrier plate 102, which includes the casting compound 107 as a dielectric, and a second capacitance Csh between the carrier plate 102 and the heat sink 110, which includes the intermediate layer 109 as a dielectric. The first capacitance Cws is typically considerably smaller than the second capacitance Csh. As a result, the electrical potential at the bonding wire 105 drops across the first capacitance Cws significantly. This additionally leads to a strong electrical field through the casting compound 107.

A known measure for obviating these problems is the use of carrier plates of thermally conductive but electrically insulating ceramic material, for example of AlN. However, this solution is very expensive.

SUMMARY

The object of the present disclosure is to overcome at least partially the disadvantages of the prior art and increase breakdown resistance between a bonding wire and the carrier substrate, or reduce the risk of secondary paths and/or partial discharges forming, in particular in an easy and low-cost way.

Various embodiments provide a lighting module with a number of semiconductor light sources, including a metallic carrier plate, wherein a number of metallic substrates (referred to hereinafter as "carrier substrates") are arranged on the carrier plate and electrically insulated from it, on which carrier substrates at least one semiconductor light source is respectively arranged. The semiconductor light sources of the carrier substrates are preferably electrically connected in series.

The distribution or "clustering" of the semiconductor light sources into n groups or "clusters", with n>1, has the effect of reducing the electrical potential difference or "cluster voltage" ΔVn=HVn−LVn over the series of semiconductor light sources arranged on a common carrier. In other words, a common carrier (to be specific the carrier plate) for all the semiconductor light sources is no longer used, but instead a set of a number of carriers that are electrically insulated from one another (to be specific the carrier substrates). This makes it possible to limit the cluster voltage ΔVn between the first semiconductor light source and the last semiconductor light source of a group or of a carrier substrate n to a desired maximum value by choosing the number m (m>=1) of semiconductor light sources located on a carrier substrate. For instance, the cluster voltage ΔVn for m semiconductor light sources connected in series with a forward voltage Vf may be determined as ΔVg=m·Vf. As a result, the electrical field F between the bonding wires and the carrier plate can be reduced. As a further result, the risk of a partial discharge within the lighting module and/or the forming of a secondary electrical path is reduced. What is more, the lighting module can be implemented easily and inexpensively.

The at least one semiconductor light source preferably includes at least one light-emitting diode. If there are a number of light-emitting diodes, they may light up in the same color or in different colors. The color may be monochrome (for example red, green, blue, etc.) or multichrome (for example white). The light emitted by the at least one light-emitting diode may also be an infrared light (IR-LED) or an ultraviolet light (UV-LED). A number of light-emitting diodes can produce a mixed light; for example a white mixed light. The at least one light-emitting diode may contain at least one wavelength-converting phosphor (conversion LED). The phosphor may alternatively or additionally be arranged away from the light-emitting diode ("remote phosphor"). The at least one light-emitting diode may take the form of at least one single packaged light-emitting diode or the form of at least one LED chip. A number of LED chips may be mounted on a common substrate ("submount"). The at least one light-emitting diode may be equipped with at least one optical system of its own and/or common optical system for beam guidance, for example at least one Fresnel lens, collimator, and so on. Instead of or in addition to inorganic light-emitting diodes, for example based on InGaN or AlInGaP, organic LEDs (OLEDs, for example polymer OLEDs) can also generally be used. Alternatively, the at least one semiconductor light source may for example include at least one diode laser.

There may also be a wavelength-converting phosphor arranged downstream of the at least one diode laser, for example in an LARP ("Laser Activated Remote Phosphor") arrangement. An LED chip, for example on the basis of a GaN structure, in particular with an electrically insulating mounting region or base region, is particularly preferred.

The metallic carrier plate may in particular include aluminum and/or copper or consist thereof. The carrier plate may in particular be shaped in the form of a circular disk or a cuboid. The thickness of the carrier plate is in particular considerably smaller than an extent in a plane of the carrier plate. The carrier plate may be flat or curved. The thickness may be constant, but is not restricted to being constant.

The metallic carrier substrates may likewise include for example aluminum and/or copper or consist thereof. A carrier substrate may also in particular be shaped in the form of a circular disk or a cuboid. The thickness of a carrier substrate is in particular considerably smaller than an extent in a plane of the carrier substrate. The thickness may be constant, but is not restricted to being constant. The carrier substrates are preferably arranged on one side of the carrier plate. The metallic carrier substrates preferably have a reflective surface, in order to keep light losses low.

A voltage or potential difference HV-LV applied to the semiconductor light sources may in particular be a high voltage. A high voltage may be understood as meaning in particular a voltage that has for an alternating voltage a root-mean-square value of at least 50 V and for a direct voltage a value of at least 120 V. A high voltage may be understood as meaning in particular a direct voltage of 230 V or more, in particular of 400 V.

In one configuration, saying that the semiconductor light sources are electrically connected in series means in particular that all the semiconductor light sources are electrically interconnected in series. In this case, the semiconductor light sources may all be interconnected in a single series, or the semiconductor light sources may be electrically distributed among a number of independently operable series or "strands". The division among a number of strands may be appropriate in particular in the case of differently colored semiconductor light sources, a strand preferably including semiconductor light sources of the same color connected in a series. In one variant, therefore, semiconductor light sources of a number of strands may be arranged on a carrier substrate.

There is a configuration where the lighting module is set up for applying an electrical potential Vc to at least one carrier substrate, in particular a respective electrical potential Vc to all the carrier substrates. The free potential Vc reduces a potential difference between the bonding wires and the carrier substrate. This leads to a considerably smaller electrical field between the bonding wire and the carrier substrate, which in turn reduces the risk of a partial discharge within the lighting module. This configuration can be implemented easily and inexpensively. It works independently of the values of Cws and Csh.

A configuration that can be implemented particularly easily and is effective is that the electrical potential Vc of the carrier substrate corresponds to the mean value of the electrical potentials at the series of the at least one semiconductor light source of this carrier substrate. The electrical potential Vc of the carrier substrate therefore corresponds to the mean value of the electrical potential HV at the first LED chip of the carrier substrate and the electrical potential LV at the last LED chip of the carrier substrate, that is to say Vc=(HV+LV)/2. As a result, a particularly small potential difference between a bonding wire and the carrier substrate is achieved, to be specific of a maximum amount (HV−LV)/2 at the bonding wire which leads from the first terminal contact of the carrier substrate to the first LED chip of the carrier substrate, or at the bonding wire which leads from the last LED chip of the carrier substrate to the second terminal contact of the carrier substrate.

A configuration that is preferred for the particularly easy implementation of applying the electrical potential Vc to a carrier substrate is that the lighting module includes a voltage divider for providing the electrical potential Vc for the at least one carrier substrate, or is connected to such a voltage divider.

The lighting module can be implemented particularly easily if an equal number of semiconductor light sources are arranged on the carrier substrates.

There is also a configuration where the carrier plate is fastened to a heat sink. This improves cooling of the semiconductor light sources.

Various embodiments also provide a method for operating a lighting module as described above, wherein an electrical potential is applied to at least one carrier substrate. The method may be configured in a way analogous to the lighting device and produces the same advantages.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
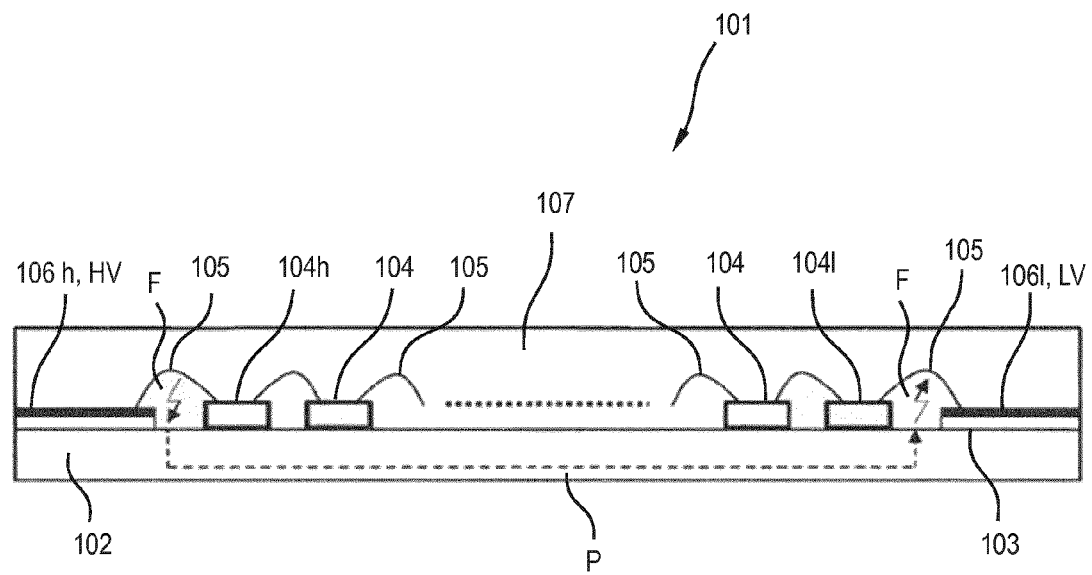
FIGS. 1 and 2 shows conventional lighting modules.
Figure 2:
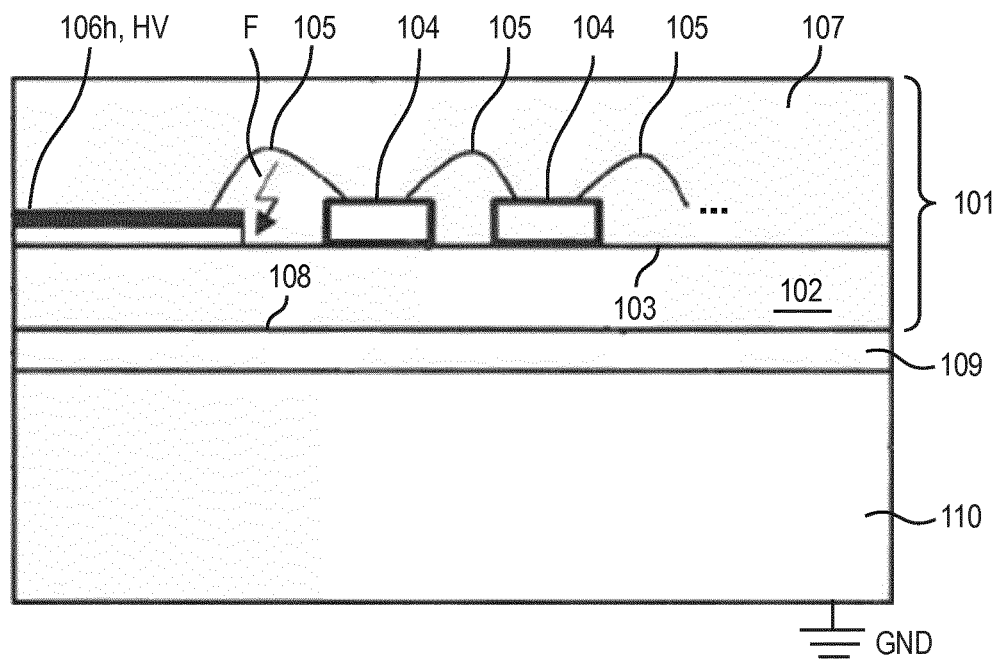
Figure 3:
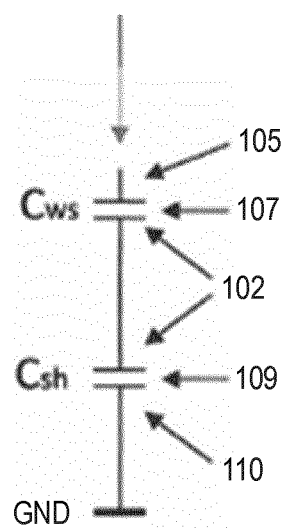
FIG. 3 shows an equivalent circuit diagram, corresponding to FIG. 2.
Figure 4:
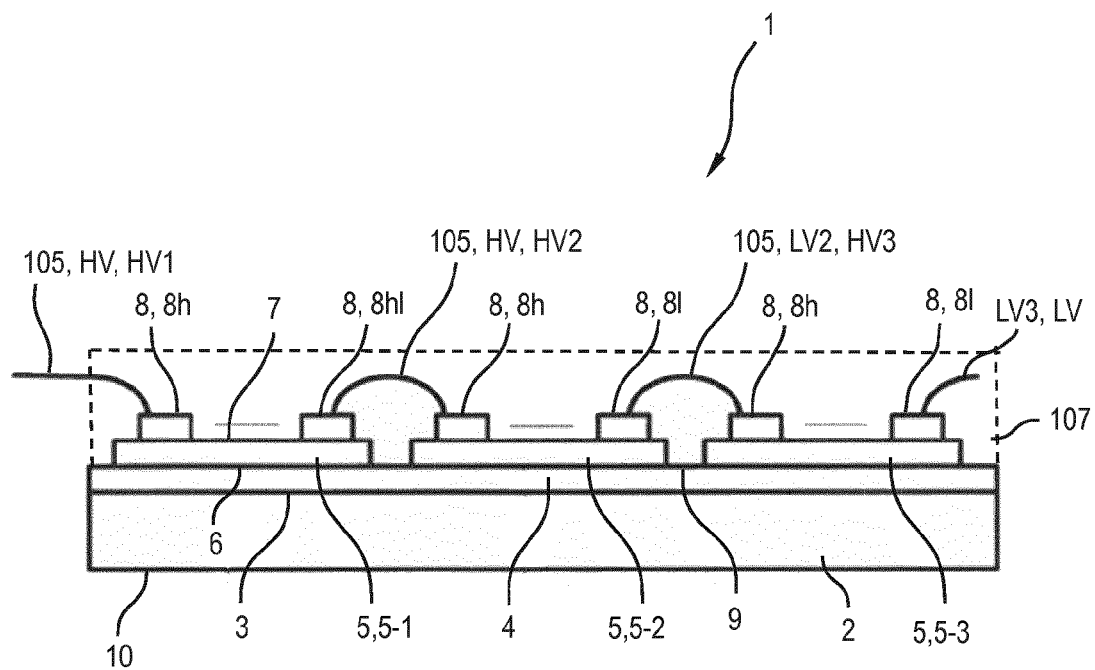
FIG. 4 shows a lighting module according to various embodiments as a sectional representation in side view.

FIG. 4 shows a lighting module 1 according to various embodiments based on CoB technology with a carrier plate 2 of aluminum, on the front side 3 of which a number of carrier substrates 5 or 5-1, 5-2 and 5-3 of aluminum have been applied laterally spaced apart over a dielectric layer 4. The plate-like carrier substrates 5 rest with their rear side 6 against the dielectric layer 4 and respectively bear on their front side 7 a number of LED chips 8, only the first LED chips 8h and last LED chips 8l respectively of which are shown here. It is assumed here purely by way of example that there are three (=3) identical carrier substrates 5 with in each case an equal number m of identical LED chips 8, for example with in each case m=45. The lighting module 1 therefore includes altogether 3 m=135 LED chips 8. All the LED chips 8 are electrically interconnected in a single series. The carrier substrates 5 may have in particular a reflective surface, for example in the manner of MIRO or MIRO SILVER from the Alanod company.

The first LED chip 8h of the first carrier substrate 5-1 is connected by way of a bonding wire 105 to a first terminal contact (not illustrated) of the lighting module 1, so that at this bonding wire 105 there is a highest electrical potential HV of the lighting module 1, which also corresponds to the highest potential HV1 of the first carrier substrate 5-1. For a computational example, here the highest electrical potential HV or HV1 may be at 400 V.

With an assumed forward voltage Vf of the LED chips 8 of 2.9 V, a cluster voltage $\Delta Vn = 45 \cdot 2.9$ V=130.5 V drops across the series of LED chips 8 of each of the n carrier substrates 5. At the bonding wire 105 which forms the electrical junction between the first carrier substrate 5-1 and the second carrier substrate 5-2 there is consequently a lowest potential LV1 of the first carrier substrate 5-1 of LV1=400 V−130.5 V=269.5 V. This corresponds to the highest electrical potential HV2 of the second carrier substrate 5-2, that is to say LV1=HV2. By analogy, at the bonding wire 105 which forms the electrical junction between the second carrier substrate 5-2 and the third carrier substrate 5-3 there is a lowest potential LV2 of the second carrier substrate 5-2 of 139 V. This corresponds to the highest electrical potential HV3 of the third carrier substrate 5-3, that is to say LV2=HV3. The last LED chip 8l of the third carrier substrate 5-3 is connected by way of a bonding wire 105 to a second terminal contact (not illustrated) of the lighting module 1, to be precise at a lowest electrical potential LV3 of the third carrier substrate 5-3 of 139 V−130.5 V=8.5 V, which corresponds to the lowest electrical potential LV of the entirety of the m=135 LED chips 8 of the lighting module 1. Altogether, there is therefore an (operating) voltage HV−LV of 391.5 V at the series of all the LED chips 8.

Here, too, the front side 9 of the carrier plate 2 is cast with casting compound 107, to be precise including the carrier substrates 5, the LED chips 8 and the bonding wires 105 connecting them. The lighting module 1 may in turn be connected by its rear side 10 to a heat sink by way of a dielectric intermediate layer (not illustrated).

Figure 5:
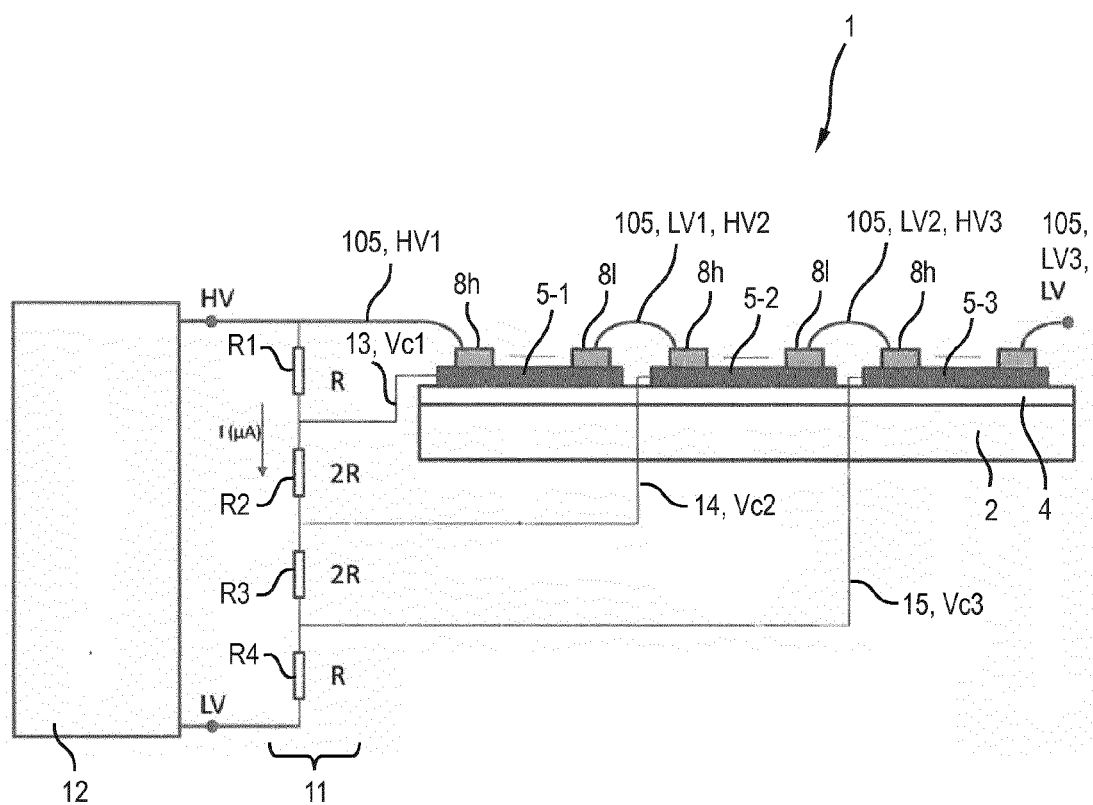
FIG. 5 shows the lighting module from FIG. 4 with a connected voltage divider.

FIG. 5 then shows the lighting module 1 from FIG. 4 in a variant with a connected voltage divider 11, which is fed by way of a high-voltage LED driver 12. The high-voltage LED driver 12 also outputs the operating voltage HV-LV to the series of m=135 LED chips 8 and for this purpose is connected on the one hand by way of a bonding wire 105 which is at the highest potential HV to the first LED chip 8h of the first driver substrate 5-1 and on the other hand by way of a bonding wire 105 which is at the lowest potential LV to the last LED chip 8l of the third driver substrate 5-3.

The voltage divider 11 is arranged electrically between these terminals HV, LV of the high-voltage LED driver 12 and has here four series-connected ohmic resistors R1, R2, R3 and R4, which have a resistance value of R, 2R, 2R and R, respectively, R having here a value of 500 kiloohms. The total resistance of the voltage divider 11 is consequently 3000 kiloohms or 3 megaohms. With an operating voltage HV-LV of 391.5 V, consequently a current I of 130.5 microamperes flows through the voltage divider 11.

An electrical line 13 branching off between the first resistor R1 and the second resistor R2 leads to the first carrier substrate 5-1, so that at the carrier substrate 5-1 there is a free electrical potential $Vc1=(5/6)\cdot(HV-LV)+LV=(HV1+LV1)/2=334.75$ V. This potential Vc1 therefore corresponds to the mean value (HV1+LV1)/2 of the electrical potentials HV1 and HV2 at the series of LED chips 8 of the first carrier substrate 5-1. The difference in terms of amount between HV1 and LV1 is only 65.25 V and represents the greatest potential difference between a bonding wire 105 connected to an LED chip 8 of the carrier substrate 5-1 and the carrier substrate 5-1. Consequently, a considerably smaller electrical field is built up between the bonding wire 105 and the first carrier substrate 5-1 than otherwise with 400 V. As a result, the forming of secondary current paths and/or partial discharges is greatly suppressed, and it is then also possible for metallic carriers 2, 5 to be used easily and inexpensively for the high-voltage operation of LED chips 8.

By analogy, an electrical line 14 branching off between the second resistor R2 and the third resistor R3 leads to the second carrier substrate 5-2, so that at the second carrier substrate 5-2 there is a free electrical potential $Vc2=(3/6)\cdot(HV-LV)+LV=(HV2+LV2)/2=204.25$ V. This potential Vc2 differs in terms of amount between HV2 and LV2 only by 65.25 V.

Furthermore, an electrical line 15 branching off between the third resistor R3 and the fourth resistor R4 also leads to the third carrier substrate 5-3, so that at the third carrier substrate 5-3 there is a free electrical potential $Vc3=(5/6)\cdot(HV-LV)+LV=(HV3+LV3)/2=73.25$ V. This potential Vc3 differs in terms of amount between HV3 and LV3 only by 65.25 V.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced. For instance, two or more than three carrier substrates 5 may also be used. The greater the number n of carrier substrates 5, and therefore the smaller the number n of LED chips 8 per carrier substrate 5 can be, the smaller the maximum potential difference between a carrier substrate 5 and an associated bonding wire 105 may be.

In principle, the carrier substrates may also be formed differently, for example have different dimensions, for example a different diameter. The carrier substrates may also bear a different number of LED chips, it being possible when there is a voltage divider for the value of the associated resistors to be adapted to it.

In general, "a", "one", etc. may be understood as meaning a singular or a plural, in particular in the sense of "at least one" or "one or more", etc., as long as this is not explicitly excluded, for example by the expression "exactly one", etc.

A numerical indication may also include the indicated number exactly and also a customary tolerance range, as long as this is not explicitly excluded.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting module with a number of semiconductor light sources, comprising:
   a metallic carrier plate,
   wherein a number of metallic carrier substrates are arranged on the carrier plate and electrically insulated from it,
   on which carrier substrates a number of semiconductor light sources are respectively arranged, and
   the semiconductor light sources are directly electrically connected to each other in series; wherein the number of semiconducting light sources arranged on the carrier substrate determines the electrical potential between the first semiconducting light source and the last semiconducting light source in the series;
   a first terminal contact of the lighting module, wherein the first terminal contact is connected to a first semiconductor light source of the series; and
   a second terminal contact of the lighting module, wherein the second terminal contact is connected to a last semiconductor light source.

2. The lighting module as claimed in claim 1, wherein the lighting module is set up for applying an electrical potential to at least one carrier substrate.

3. The lighting module as claimed in claim 2, wherein the lighting module is set up for applying an electrical potential to all the carrier substrates.

4. The lighting module as claimed in claim 2, wherein the electrical potential of the carrier substrate corresponds to the mean value of the electrical potentials at the series of the at least one semiconductor light source of this carrier substrate.

5. The lighting module as claimed in claim 2, wherein the lighting module comprises a voltage divider for providing the electrical potential for the at least one carrier substrate, or is connected to such a voltage divider.

6. The lighting module as claimed in claim 1, wherein an equal number of semiconductor light sources are arranged on the carrier substrates.

7. The lighting module as claimed in claim 1, wherein all the semiconductor light sources are electrically connected in series.

8. The lighting module as claimed in claim 1, wherein the carrier plate is fastened to a heat sink.

9. A method for operating a lighting module, the lighting module with a number of semiconductor light sources, comprising:
   a metallic carrier plate,
   wherein a number of metallic carrier substrates are arranged on the carrier plate and electrically insulated from it,
   on which carrier substrates a number of semiconductor light sources are respectively arranged, and
   the semiconductor light sources are directly electrically connected to each other in series; wherein the number of semiconducting light sources arranged on the carrier substrate determine the electrical potential between a first semiconducting light source and a last semiconducting light source in the series;
   a first terminal contact of the lighting module, wherein the first terminal contact is connected to the first semiconductor light source of the series;
   and a second terminal contact of the lighting module, wherein the second terminal contact is connected to the last semiconductor light source;
   wherein a mains voltage is applied to the first terminal contact.

10. The lighting module as claimed in claim 1, wherein the semiconductor light sources are LED chips.

11. The method as claimed in claim 9,
    wherein the lighting module comprises a voltage divider for providing the electrical potential for the at least one carrier substrate, or is connected to such a voltage divider.

12. A lighting module with a number of semiconductor light sources, comprising:
    a metallic carrier plate,
    wherein a number of metallic carrier substrates are arranged on the carrier plate and electrically insulated from it,
    on which carrier substrates at least one semiconductor light source is respectively arranged, and
    the carrier substrates are electrically connected in series;
    wherein the lighting module comprises a voltage divider for providing an electrical potential for at least one carrier substrate, or is connected to such a voltage divider.

13. A lighting module as claimed in claim 1, wherein the semiconductor light sources are electrically connected in at least one series.

* * * * *